(12) United States Patent
Chen et al.

(10) Patent No.: US 8,941,167 B2
(45) Date of Patent: Jan. 27, 2015

(54) ERASABLE PROGRAMMABLE SINGLE-PLOY NONVOLATILE MEMORY

(75) Inventors: Wei-Ren Chen, Pingtung County (TW); Te-Hsun Hsu, Hsinchu County (TW); Shih-Chen Wang, Taipei (TW); Hsin-Ming Chen, Hsinchu (TW); Ching-Sung Yang, Hsinchu (TW)

(73) Assignee: Ememory Technology Inc., Hsin-Chu (TW)

( * ) Notice: Subject to any disclaimer, the term of this patent is extended or adjusted under 35 U.S.C. 154(b) by 441 days.

(21) Appl. No.: 13/415,185

(22) Filed: Mar. 8, 2012

(65) Prior Publication Data

US 2013/0234227 A1    Sep. 12, 2013

(51) Int. Cl.
*H01L 29/788* (2006.01)

(52) U.S. Cl.
USPC .................. 257/315; 257/318; 257/320

(58) Field of Classification Search
CPC ............ H01L 27/11558; H01L 29/788; H01L 29/42328; H01L 29/66825
USPC .................. 257/314, 315, 316, 320, 318
See application file for complete search history.

(56) References Cited

U.S. PATENT DOCUMENTS

| | | |
|---|---|---|
| 5,736,764 A | 4/1998 | Chang |
| 5,761,121 A | 6/1998 | Chang |
| 5,841,165 A | 11/1998 | Chang et al. |
| 6,071,775 A | 6/2000 | Choi et al. |
| 6,127,700 A | 10/2000 | Bulucea |
| 6,166,954 A | 12/2000 | Chern |
| 6,255,169 B1 | 7/2001 | Li et al. |
| 6,678,190 B2 | 1/2004 | Yang et al. |
| 6,711,064 B2 * | 3/2004 | Hsu et al. ................. 365/185.29 |
| 7,078,761 B2 | 7/2006 | Wang et al. |
| 7,595,244 B1 | 9/2009 | Bulucea et al. |
| 2003/0235082 A1 | 12/2003 | Hsu et al. |
| 2004/0065917 A1 | 4/2004 | Fan et al. |
| 2005/0199936 A1 | 9/2005 | Wang et al. |
| 2008/0006868 A1 | 1/2008 | Hsu et al. |
| 2008/0266959 A1 | 10/2008 | Haggag et al. |
| 2009/0052245 A1 | 2/2009 | Li et al. |
| 2009/0059678 A1 | 3/2009 | Strenz et al. |

(Continued)

FOREIGN PATENT DOCUMENTS

| | | |
|---|---|---|
| JP | 01-262669 | 10/1989 |
| JP | 08-046067 A | 2/1996 |

(Continued)

OTHER PUBLICATIONS

Japan Patent Office, "Office Action", Dec. 5, 2013.

(Continued)

*Primary Examiner* — Matthew W Such
*Assistant Examiner* — Scott Stowe
(74) *Attorney, Agent, or Firm* — WPAT, PC; Justin King

(57) ABSTRACT

An erasable programmable single-poly nonvolatile memory includes a first PMOS transistor comprising a select gate, a first p-type doped region, and a second p-type doped region, wherein the select gate is connected to a select gate voltage, and the first p-type doped region is connected to a source line voltage; a second PMOS transistor comprising the second p-type doped region, a third p-type doped region, and a floating gate, wherein the third p-type doped region is connected to a bit line voltage; and an erase gate region adjacent to the floating gate, wherein the erase gate region is connected to an erase line voltage.

20 Claims, 10 Drawing Sheets

(56) References Cited

U.S. PATENT DOCUMENTS

| | | |
|---|---|---|
| 2009/0085090 A1 | 4/2009 | Nagai |
| 2009/0159946 A1 | 6/2009 | Huang et al. |
| 2010/0149874 A1 | 6/2010 | Leung et al. |
| 2010/0157669 A1 | 6/2010 | Audzeyeu et al. |
| 2010/0163956 A1 | 7/2010 | Lee et al. |
| 2010/0329016 A1 | 12/2010 | Taniguchi et al. |
| 2012/0056257 A1 | 3/2012 | Choi et al. |
| 2012/0236646 A1 | 9/2012 | Hsu et al. |
| 2013/0221488 A1 | 8/2013 | Rao |

FOREIGN PATENT DOCUMENTS

| | | |
|---|---|---|
| JP | 2003017597 | 1/2003 |
| JP | 2004200553 A | 7/2004 |
| JP | 2007-080393 | 3/2007 |
| JP | 2007173821 A | 7/2007 |
| JP | 2007184632 | 7/2007 |
| JP | 2009-081181 | 4/2009 |
| JP | 2009-088060 | 4/2009 |

OTHER PUBLICATIONS

Dirk Wellekens, Single Poly Cell as the Best Choice for Radiation-Hard Floating Gate EEPROM Technology, IEEE Transactions on Nuclear Science, vol. 40, No. 6, 1619-1627, Belgium.
European Patent Office, "Search Report", Jul. 26, 2013.
European Patent Office, "Search Report", Sep. 3, 2013.
U.S. Patent and Trademark Office "Office Action", Mar. 20, 2014.
Japan Patent Office, "Office Action", Apr. 3, 2014.
Di Bartolomeo et al. "A single-poly EEPROM cell for embedded memory applications", Solid-State Electronics 53, (2009), 644-648.
Lin et al. "A single-poly EEPROM Cell Structure Compatible to Standard CMOS Process" Solid-State Electronics 51, (2007), 888-893.
Vega-Castillo et al. "Single poly PMOS-based CMOS-compatible low voltage OTP", Technical University Hamburg-Harbug, Hamburg, Germany, (2005).
Taiwan Intellectual Property Office, "Office Action", Jun. 19, 2014.
United States Patent and Trademark Office, "Final Office Action", Oct. 10, 2014.
Japan Patent Office, "Office Action", Aug. 26, 2014.

* cited by examiner

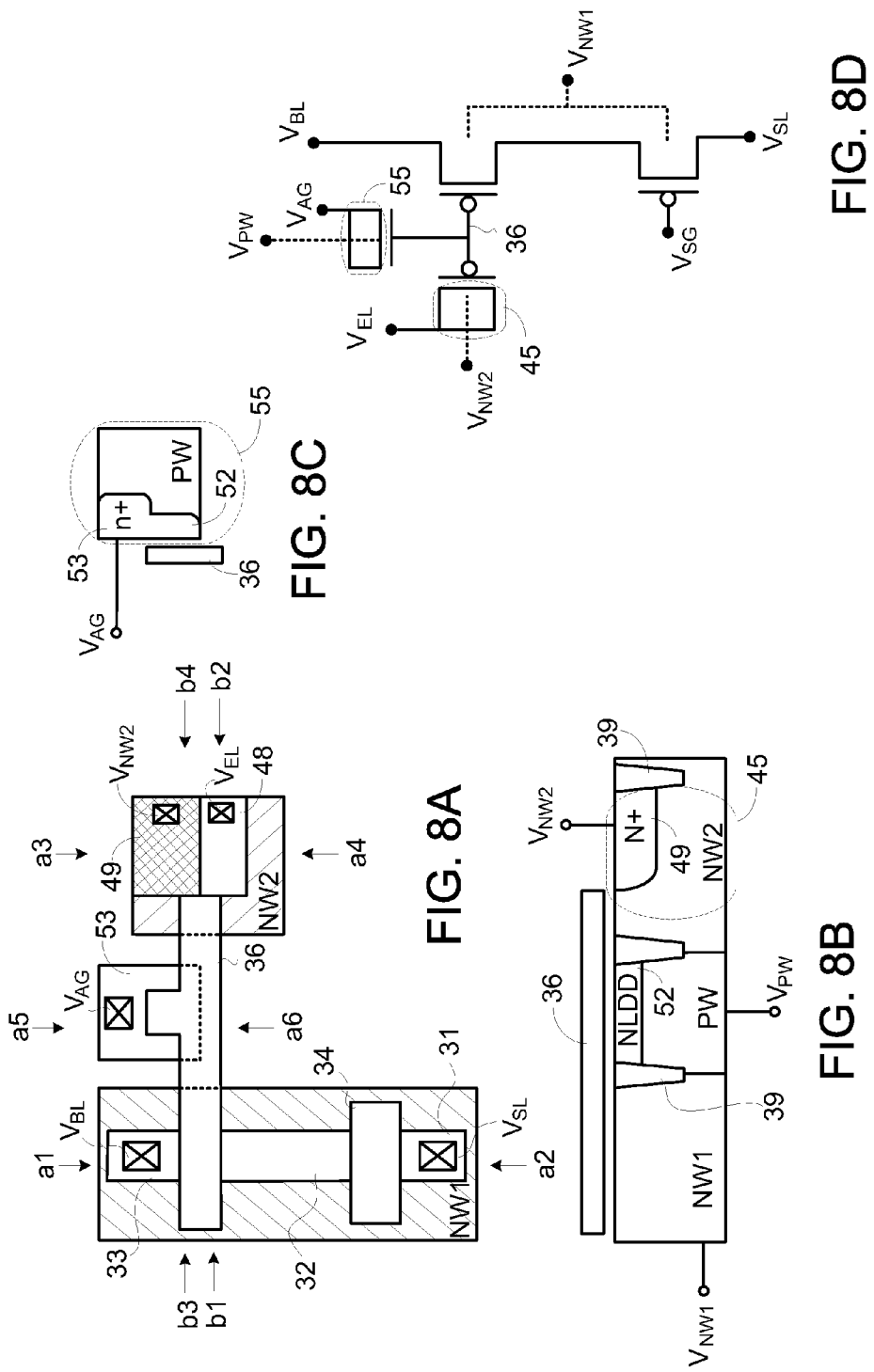

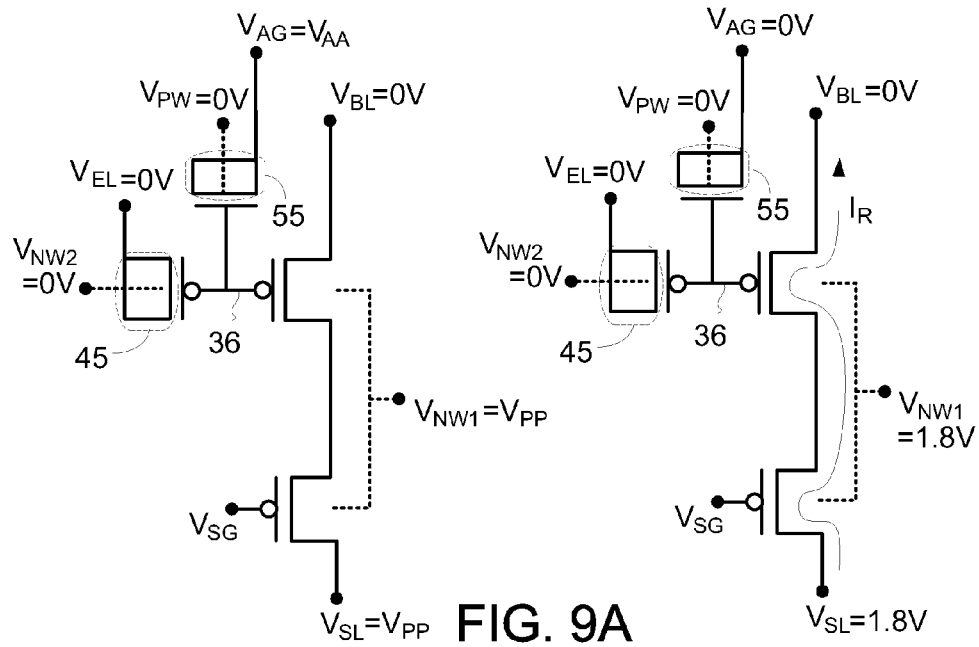
FIG. 9A
FIG. 9D
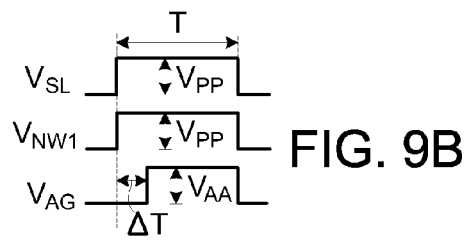
FIG. 9B
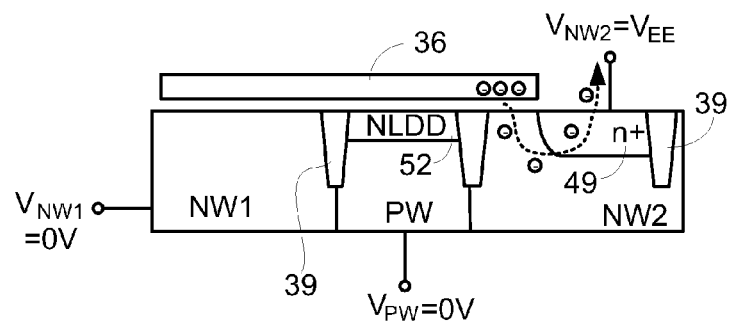
FIG. 9C

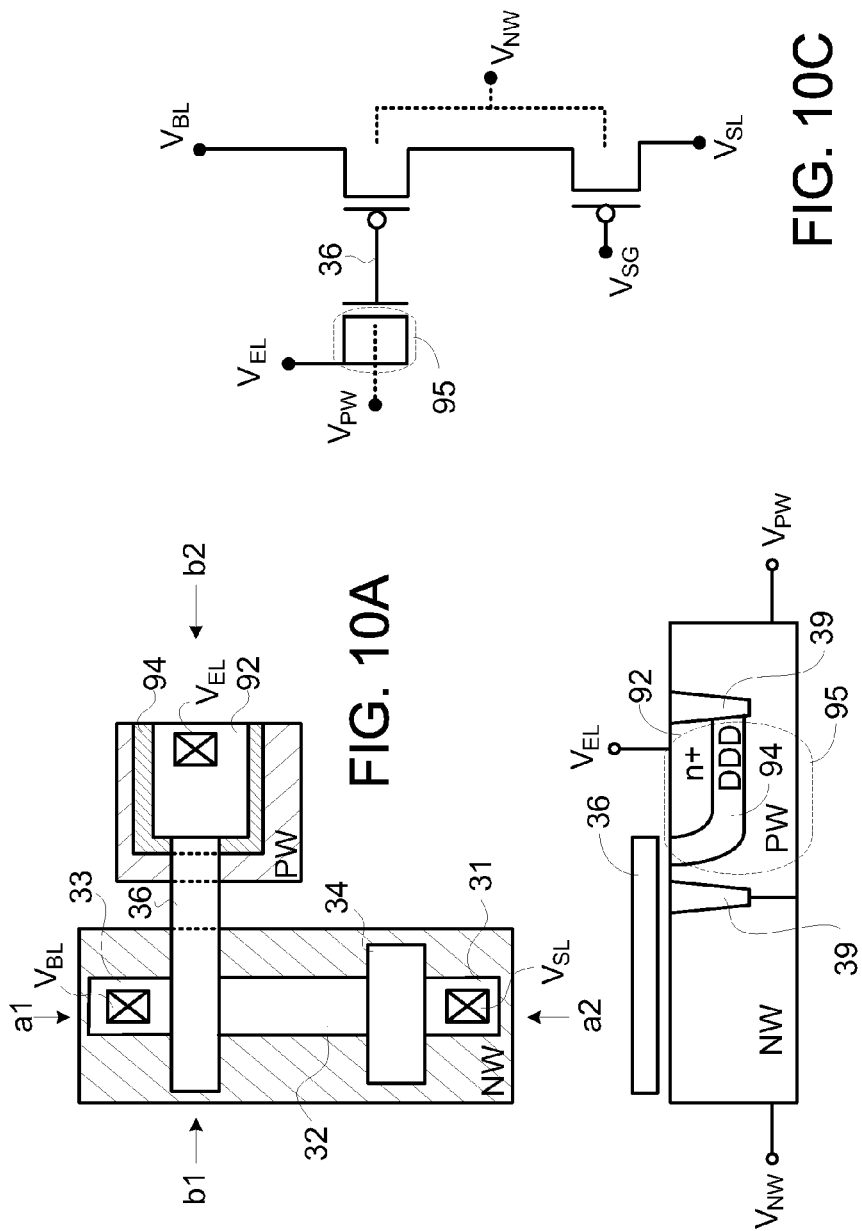

US 8,941,167 B2

ERASABLE PROGRAMMABLE SINGLE-PLOY NONVOLATILE MEMORY

FIELD OF THE INVENTION

The present invention relates to a nonvolatile memory, and more particularly to an erasable programmable single-poly nonvolatile memory.

BACKGROUND OF THE INVENTION

FIG. 1 is a schematic cross-sectional view illustrating a conventional programmable dual-poly nonvolatile memory. The programmable dual-poly nonvolatile memory is also referred as a floating-gate transistor. As shown in FIG. 1, this nonvolatile memory comprises two stacked and separated gates. The upper gate is a control gate 12, which is connected to a control line C. The lower gate is a floating gate 14. In addition, an n-type doped source region and an n-type doped drain region are constructed in a P-substrate. The n-type doped source region is connected to a source line S. The n-type doped drain region is connected to a drain line D.

In a case that the nonvolatile memory is in a programmed state, a high voltage (e.g. +16V) is provided by the drain line D, a ground voltage is provided by the source line S, and a control voltage (e.g. +25V) is provided by the control line C. Consequently, during the electrons are transmitted from the source line S to the drain line D through an n-channel region, the hot carriers (e.g. hot electrons) are attracted by the control voltage on the control gate 12 and injected into the floating gate 14. Under this circumstance, a great number of carriers are accumulated in the floating gate 14. Consequently, the programmed state may be considered as a first storage state (e.g. "0").

In a case that the nonvolatile memory is in a non-programmed state, no carrier is injected into the floating gate 14, and thus the non-programmed state may be considered as a second storage state (e.g. "1").

In other words, the characteristic curves of the drain current (id) and the gate-source voltage Vgs (i.e. an id-Vgs characteristic curve) in the first storage state and the id-Vgs characteristic curve in the second storage state are distinguished. Consequently, the storage state of the floating-gate transistor may be realized according to the variation of the id-Vgs characteristic curve.

However, since the floating gate 14 and the control gate 12 of the programmable dual-poly nonvolatile memory should be separately produced, the process of fabricating the programmable dual-poly nonvolatile memory needs more steps and is incompatible with the standard CMOS manufacturing process.

U.S. Pat. No. 6,678,190 discloses a programmable single-poly nonvolatile memory. FIG. 2A is a schematic cross-sectional view illustrating a conventional programmable single-poly nonvolatile memory disclosed in U.S. Pat. No. 6,678,190. FIG. 2B is a schematic top view illustrating the conventional programmable single-poly nonvolatile memory of FIG. 2A. FIG. 2C is a schematic circuit diagram illustrating the conventional programmable single-poly nonvolatile memory of FIG. 2A.

Please refer to FIGS. 2A~2C. The conventional programmable single-poly nonvolatile memory comprises two serially-connected p-type metal-oxide semiconductor (PMOS) transistors. The first PMOS transistor is used as a select transistor, and a select gate 24 of the first PMOS transistor is connected to a select gate voltage $V_{SG}$. A p-type doped source region 21 is connected to a source line voltage $V_{SL}$. Moreover, a p-type doped drain region 22 may be considered as a combination of a p-type doped drain region of the first PMOS transistor and a first p-type doped region of the second PMOS transistor. A floating gate 26 is disposed over the second PMOS transistor. A second p-type doped region 23 of the second PMOS transistor is connected to a bit line voltage $V_{BL}$. Moreover, these PMOS transistors are constructed in an N-well region (NW). The N-well region is connected to an N-well voltage $V_{NW}$.

By properly controlling the select gate voltage $V_{SG}$, the source line voltage $V_{SL}$, the bit line voltage $V_{BL}$ and the N-well voltage $V_{NW}$, the conventional programmable single-poly nonvolatile memory may be operated in a programmed state or a read state.

Since the two PMOS transistors of the conventional programmable single-poly nonvolatile memory have respective gates 24 and 26, the process of fabricating the conventional programmable single-poly nonvolatile memory is compatible with the standard CMOS manufacturing process.

As described in FIGS. 1 and 2, the nonvolatile memory is programmable. The electrical property of the nonvolatile memory is only utilized to inject a great number of hot carriers to the floating gate. However, the electrical property fails to be utilized to remove the carriers from the floating gate. That is, for achieving the data-erasing function, the carriers stored in the floating gate may be removed from the floating gate by exposing ultraviolet (UV) light to the nonvolatile memory. These nonvolatile memories are named as one time programming (OTP) memories.

Therefore, for multi-times programming (MTP) memories design, there is a need of providing an erasable programmable single-poly nonvolatile memory.

SUMMARY OF THE INVENTION

The present invention provides an erasable programmable single-poly nonvolatile memory in order to obviate the drawbacks encountered from the prior art.

The present invention provides an erasable programmable single-poly nonvolatile memory, comprising: a first PMOS transistor comprising a select gate, a first p-type doped region, and a second p-type doped region, wherein the select gate is connected to a select gate voltage ($V_{SG}$), and the first p-type doped region is connected to a source line voltage ($V_{SL}$); a second PMOS transistor comprising the second p-type doped region, a third p-type doped region, and a floating gate, wherein the third p-type doped region is connected to a bit line voltage ($V_{BL}$); and an erase gate region adjacent to the floating gate, wherein the erase gate region is connected to an erase line voltage ($V_{EL}$). Moreover, these PMOS transistors are constructed in an N-well region (NW). The N-well region is connected to an N-well voltage $V_{NW}$.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 8A~8D schematically illustrate an erasable programmable single-poly nonvolatile memory according to a third embodiment of the present invention;

FIGS. 9A~9D schematically and respectively illustrate the bias voltages of the erasable programmable single-poly nonvolatile memory in a programmed state, an erased state and a read state according to the third embodiment of the present invention;

FIGS. 10A~10C schematically illustrate an erasable programmable single-poly nonvolatile memory according to a fourth embodiment of the present invention.

DETAILED DESCRIPTION OF PREFERRED EMBODIMENTS

Figure 2A:
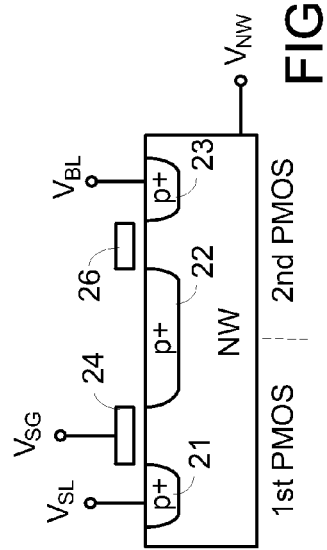
FIG. 2A (prior art) is a schematic cross-sectional view illustrating a conventional programmable single-poly nonvolatile memory disclosed in U.S. Pat. No. 6,678,190.
Figure 2B:
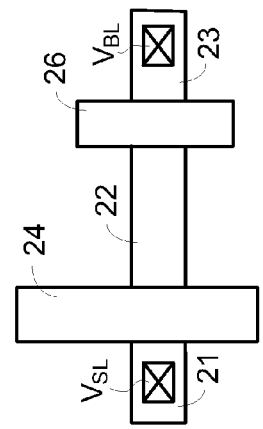
FIG. 2B (prior art) is a schematic top view illustrating the conventional programmable single-poly nonvolatile memory of FIG. 2A.
Figure 2C:
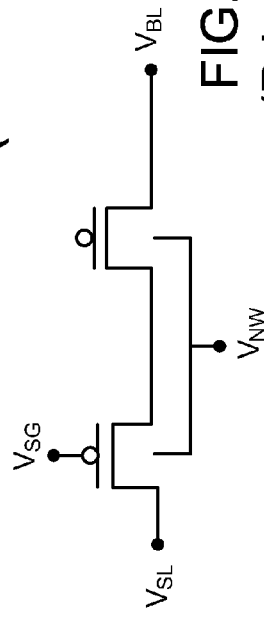
FIG. 2C (prior art) is a schematic circuit diagram illustrating the conventional programmable single-poly nonvolatile memory of FIG. 2A.
Figure 1:
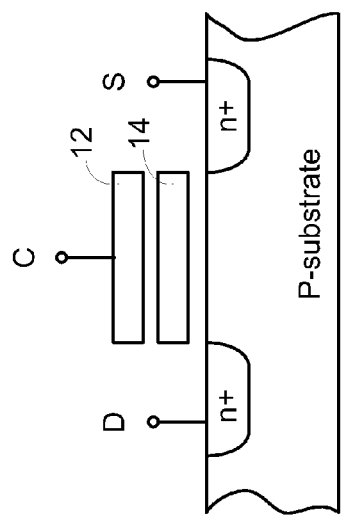
FIG. 1 (prior art) is a schematic cross-sectional view illustrating a conventional programmable dual-poly nonvolatile memory.
Figure 3D:
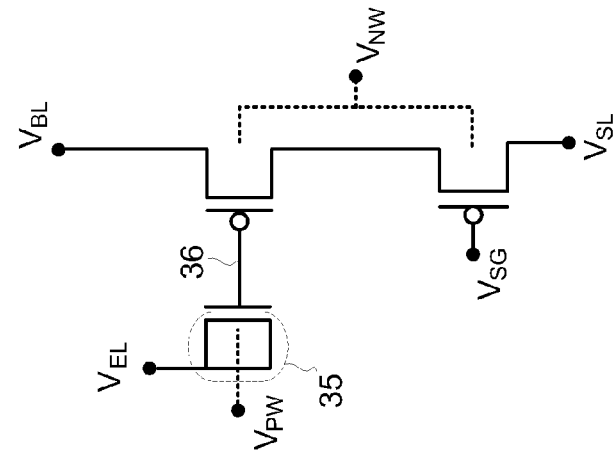
FIGS. 3A~3D schematically illustrate an erasable programmable single-poly nonvolatile memory according to a first embodiment of the present invention.
Figure 3A:
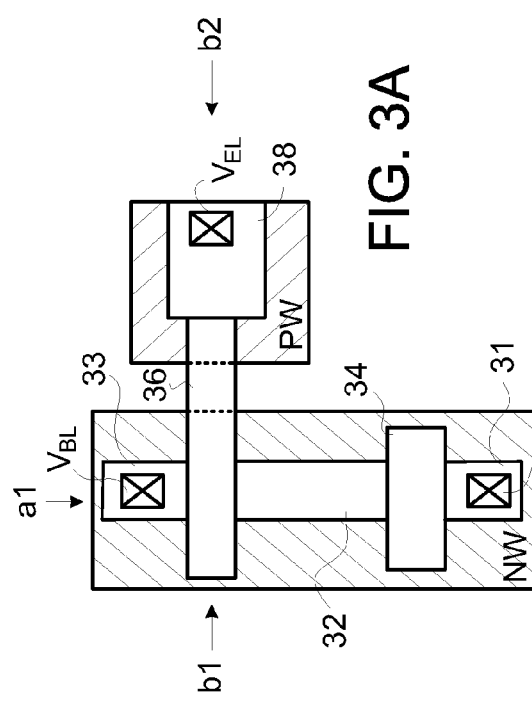
Figure 3C:
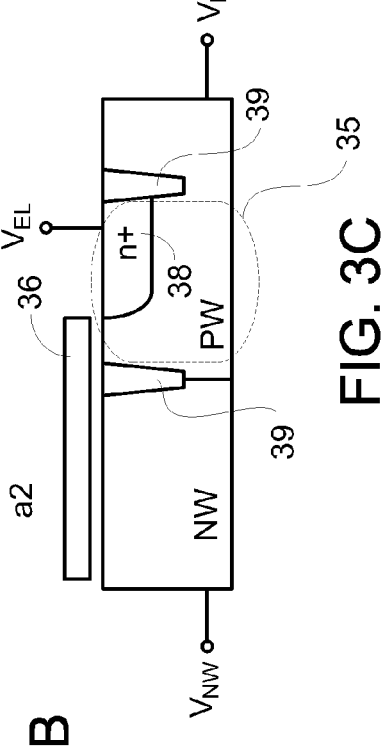
Figure 3B:
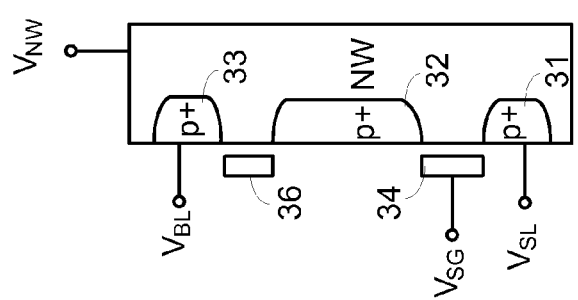

FIGS. 3A~3D schematically illustrate an erasable programmable single-poly nonvolatile memory according to a first embodiment of the present invention. FIG. 3A is a schematic top view illustrating the erasable programmable single-poly nonvolatile memory according to the first embodiment of the present invention. FIG. 3B is a schematic cross-sectional view illustrating the erasable programmable single-poly nonvolatile memory of FIG. 3A and taken along a first direction (a1-a2). FIG. 3C is a schematic cross-sectional view illustrating the erasable programmable single-poly nonvolatile memory of FIG. 3A and taken along a second direction (b1-b2). FIG. 3D is a schematic equivalent circuit diagram of the erasable programmable single-poly nonvolatile memory according to the first embodiment of the present invention.

As shown in FIGS. 3A and 3B, the erasable programmable single-poly nonvolatile memory of the first embodiment comprises two serially-connected p-type metal-oxide semiconductor (PMOS) transistors. These two PMOS transistors are constructed in an N-well region (NW). Three p-type doped regions 31, 32 and 33 are formed in the N-well region (NW). In addition, two polysilicon gates 34 and 36 are spanned over the areas between the three p-type doped regions 31, 32 and 33.

The first PMOS transistor is used as a select transistor, and the polysilicon gate 34 (also referred as a select gate) of the first PMOS transistor is connected to a select gate voltage $V_{SG}$. The p-type doped region 31 is a p-type doped source region and connected to a source line voltage $V_{SL}$. The p-type doped region 32 is a p-type doped drain region, which may be considered as a combination of a p-type doped drain region of the first PMOS transistor and a first p-type doped region of the second PMOS transistor. The polysilicon gate 36 (also referred as a floating gate) is disposed over the second PMOS transistor. The p-type doped region 33 is a second p-type doped region of the second PMOS transistor and connected to a bit line voltage $V_{BL}$. Moreover, the N-well region (NW) is connected to an N-well voltage $V_{NW}$.

Generally, during the ion implantation processes of forming the p-type doped regions 31, 32 and 33, the floating gate 36 and the select gate 34 are used as the implantation mask layers. Consequently, the floating gate 36 and the select gate 34 over the N-well region (NW) are p-type gates.

As shown in FIGS. 3A and 3C, the erasable programmable single-poly nonvolatile memory of the first embodiment comprises an n-type metal-oxide semiconductor (NMOS) transistor or a combination of the floating gate 36 and an erase gate region 35. The NMOS transistor is constructed in a P-well region (PW). An n-type doped region 38 is formed in the P-well region (PW). In other words, the erase gate region 35 includes the P-well region (PW) and the n-type doped regions 38.

As shown in FIG. 3A, the floating gate 36 is extended to and is adjacent to the erase gate region 35. Moreover, the n-type doped region 38 may be considered as a combination of an n-type doped source region and an n-type doped drain region of the NMOS transistor and the floating gate 36 may be considered as a gate of the NMOS transistor. The n-type doped region 38 is connected to an erase line voltage $V_{EL}$. In addition, the P-well region (PW) is connected to a P-well voltage VPW. As shown in FIG. 3C, an isolation structure 39 is formed between the P-well region (PW) and the N-well region (NW). For example, the isolation structure 39 is a shallow trench isolation (STI) structure.

During the ion implantation process of forming the n-type doped region 38, the floating gate 36 is used as the implantation mask layer. Consequently, the floating gate 36 over the erase gate region 35 is an n-type gate.

Figure 4A:
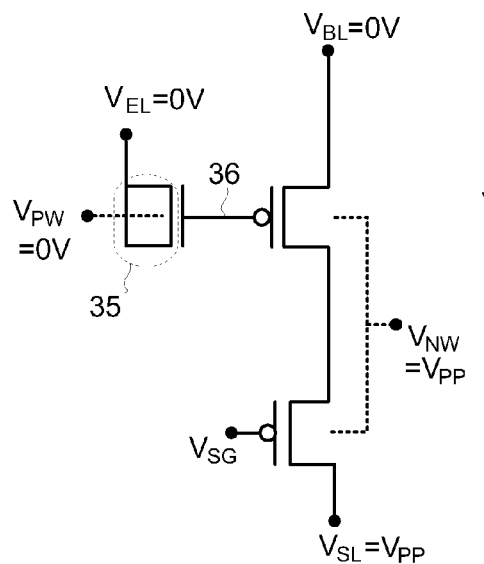
FIGS. 4A~4C schematically and respectively illustrate the bias voltages of the erasable programmable single-poly nonvolatile memory in a programmed state, an erased state and a read state according to the first embodiment of the present invention.
Figure 4C:
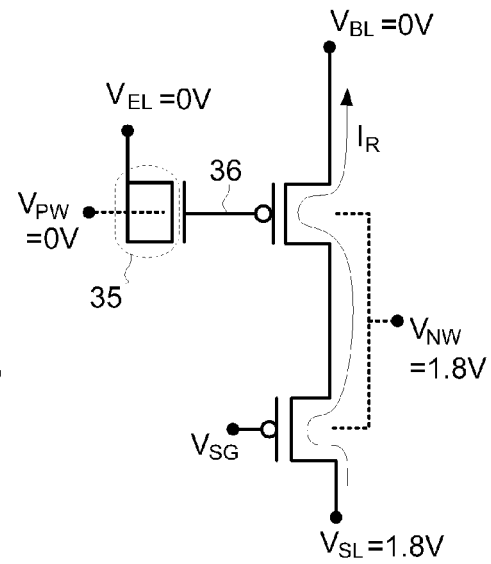
Figure 4B:
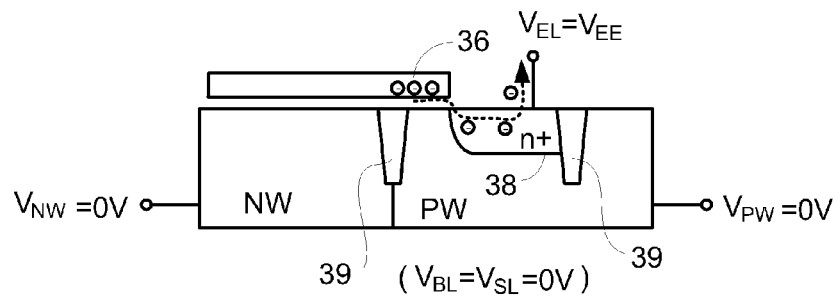

FIGS. 4A~4C schematically and respectively illustrate the bias voltages of the erasable programmable single-poly nonvolatile memory in a programmed state, an erased state and a read state according to the first embodiment of the present invention.

Please refer to FIG. 4A. In the programmed state, each of the bit line voltage $V_{BL}$, the erase line voltage $V_{EL}$ and the P-well voltage $V_{PW}$ is equal to a ground voltage (0V). Whereas, each of the N-well voltage $V_{NW}$ and the source line voltage $V_{SL}$ is equal to a first positive voltage $V_{pp}$. The first positive voltage $V_{pp}$ is in the range between +3.0V and +7.5V. In a case that the hot carriers (e.g. electrons) are transmitted through a channel region corresponding to the floating gate 36, the hot carriers are injected into the floating gate 36. Obviously, according to the present invention, the control gate used in the conventional nonvolatile memory for controlling the injection of the hot carriers into the floating gate may be omitted. In addition, the operating principles of the nonvolatile memory of the present invention in the programmed state are similar to those of the conventional nonvolatile memory (see disclosed in U.S. Pat. No. 6,678,190), and are not redundantly described herein.

Please refer to FIG. 4B. In the erased state, each of the bit line voltage $V_{BL}$, the source line voltage $V_{SL}$, the N-well voltage $V_{NW}$ and the P-well voltage $V_{PW}$ is equal to the ground voltage (0V). Whereas, the erase line voltage $V_{EL}$ is equal to a second positive voltage $V_{EE}$. The second positive voltage $V_{EE}$ is in the range between +6.5V and +18V. As shown in FIG. 4B, if the erase line voltage $V_{EL}$ is equal to the second positive voltage $V_{EE}$, the storage carriers (e.g. electrons) are removed from the floating gate 36 and discharged out of the nonvolatile memory through the n-type doped region 38. Consequently, after the erased state, no carrier is stored in the floating gate 36.

Please refer to FIG. 4C. In the read state, the bit line voltage $V_{BL}$ is equal to ground voltage (0V), the source line voltage $V_{SL}$ is equal to 1.8V, the N-well voltage $V_{NW}$ is equal to 1.8V, the erase line voltage $V_{EL}$ is equal to ground voltage (0V), and the P-well voltage $V_{PW}$ is equal to the ground voltage (0V). Depending on whether the hot carriers are stored in the floating gate 36, different magnitudes of the read current $I_R$ are acquired. That is, in the read state, the storage state of the nonvolatile memory may be realized according to the read current $I_R$. For example, in the first storage state (e.g. "0" state), the read current $I_R$ is higher than 5 µA. In the second storage state (e.g. "1" state), the read current $I_R$ is lower than 0.1 µA. Furthermore, the above mentioned bias voltages maybe need not be limited to the fixed voltages. For example, the bit line voltage $V_{BL}$ can be in the range between 0V to 0.5V, the source line voltage $V_{SL}$ and the N-well voltage $V_{NW}$ can be in the range between $V_{DD}$ and $V_{DD2}$, and the erase line voltage $V_{EL}$ can be in the range between 0V and $V_{DD2}$, wherein the $V_{DD}$ is the core device voltage of the nonvolatile memory and the $V_{DD2}$ is IO device voltage of the nonvolatile memory.

Figures 5A, 5B:
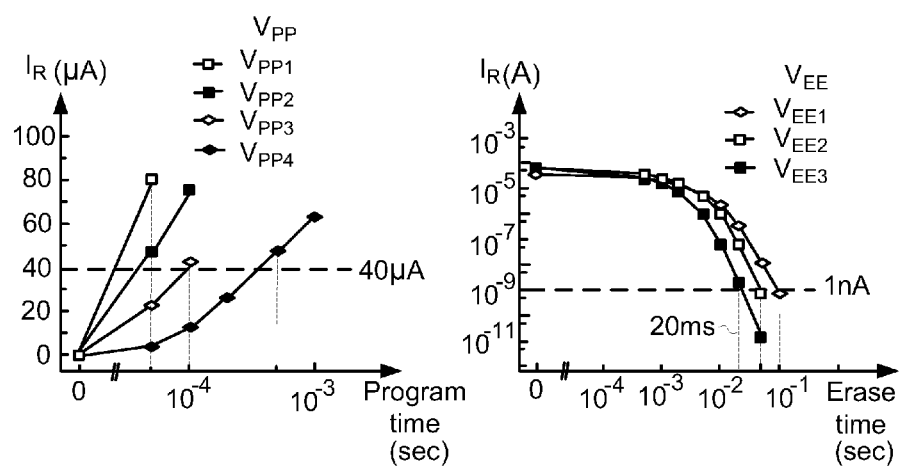
FIG. 5A is a plot illustrating the read current generated in the first storage state after different magnitudes of the first positive voltage are applied to the nonvolatile memory of the first embodiment in the programmed state for different programming time.
FIG. 5B is a plot illustrating the read current generated in the second storage state after different magnitudes of the second positive voltage are applied to the nonvolatile memory of the first embodiment in the erased state for different erasing time.

FIG. 5A is a plot illustrating the read current generated in the first storage state after different magnitudes of the first positive voltage ($V_{PP}$) are applied to the nonvolatile memory of the first embodiment in the programmed state for different program time. In the FIG. 5A, $V_{PP4}$ is larger than $V_{PP3}$, $V_{PP3}$ is larger than $V_{PP2}$, and $V_{PP2}$ is larger than $V_{PP1}$. In a case that the first positive voltage Vpp is $V_{PP1}$ or $V_{PP2}$, it only takes a program time of 50µ seconds to allow the read current IR to be higher than 40 µA. In a case that the first positive voltage Vpp is $V_{PP3}$, it only takes a program time of 100µ seconds to allow the read current IR to be higher than 40 µA. In a case that the first positive voltage Vpp is $V_{PP4}$, it only takes a program time of 500µ seconds to allow the read current IR to be higher than 40 µA.

FIG. 5B is a plot illustrating the read current generated in the second storage state after different magnitudes of the second positive voltage are applied to the nonvolatile memory of the first embodiment in the erased state for different program time. In the FIG. 5B, $V_{EE3}$ is larger than $V_{EE2}$, and $V_{EE2}$ is larger than $V_{EE1}$. In a case that the read current IR is lower than 1 nA, the nonvolatile memory is in the second storage state. In a case that the second positive voltage $V_{EE}$ is $V_{EE3}$, it only takes an erase time of 20 milliseconds to allow the read current IR to be lower than 1 nA. In a case that the second positive voltage $V_{EE}$ is $V_{EE2}$, it only takes an erase time of 50 milliseconds to allow the read current IR to be lower than 1 nA. In a case that the second positive voltage $V_{EE}$ is $V_{EE1}$, it only takes an erase time of 100 milliseconds to allow the read current IR to be lower than 1 nA.

Figures 5C, 5D:
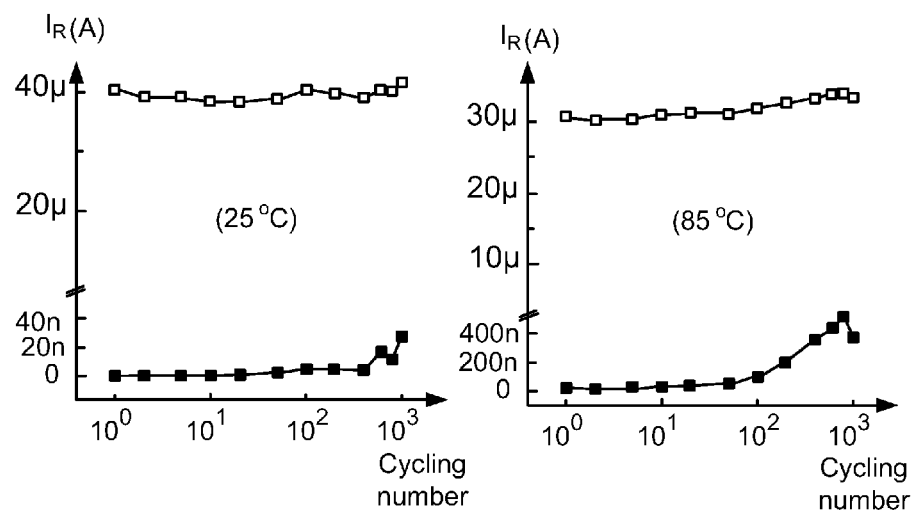
FIG. 5C is a plot illustrating the relationship between the read current $I_R$ and the cycling number of the nonvolatile memory of the first embodiment at 25° C.
FIG. 5D is a plot illustrating the relationship between the read current $I_R$ and the cycling number of the nonvolatile memory of the first embodiment at 85° C.

FIG. 5C is a plot illustrating the relationship between the read current IR and the cycling number of the nonvolatile memory of the first embodiment at 25° C. FIG. 5D is a plot illustrating the relationship between the read current IR and the cycling number of the nonvolatile memory of the first embodiment at 85° C. The cycling number denotes the cycles of executing the programmed stated and the erased state. For example, the cycling number 1 denotes a cycle of executing one programmed stated and one erased state. As shown in FIG. 5C, at 25° C. and after 1000 cycles, the nonvolatile memory of the first embodiment in the first storage state has a read current IR of about 40 µA, and the nonvolatile memory of the first embodiment in the second storage state has a read current IR of about 40 nA. As shown in FIG. 5D, at 85° C. and after 1000 cycles, the nonvolatile memory of the first embodiment in the first storage state has a read current IR of about 30 µA, and the nonvolatile memory of the first embodiment in the second storage state has a read current IR of about 400 nA. Obviously, after 1000 cycles, the first storage state and the second storage state of the nonvolatile memory of the first embodiment are distinguishable according to the read current $I_R$.

From the above discussions, the floating gate 36 of the nonvolatile memory of the first embodiment is made of p-type polysilicon over the N-well region (NW) and n-type polysilicon over the P-well region (PW). In the erased state, the floating gate 36 becomes hindrance from moving the storage carriers, especially in a low temperature operation, and thus the erase time is relatively longer.

Figure 6A:
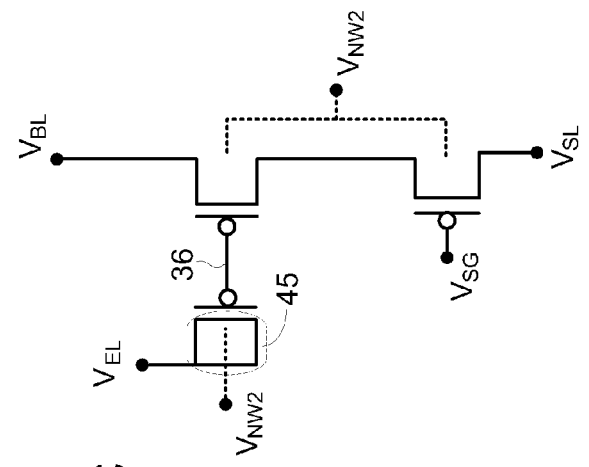
FIGS. 6A~6D schematically illustrate an erasable programmable single-poly nonvolatile memory according to a second embodiment of the present invention.
Figure 6B:
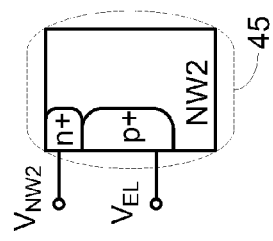
Figure 6C:
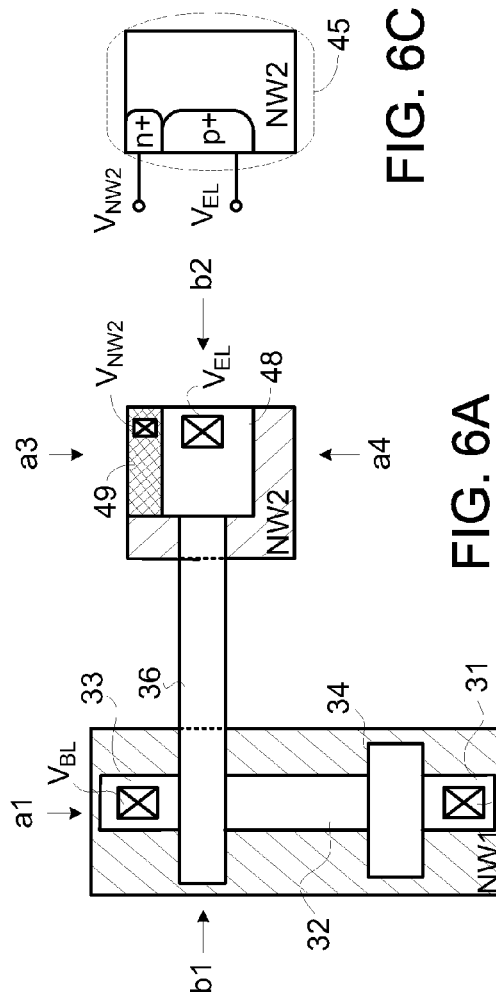
Figure 6D:
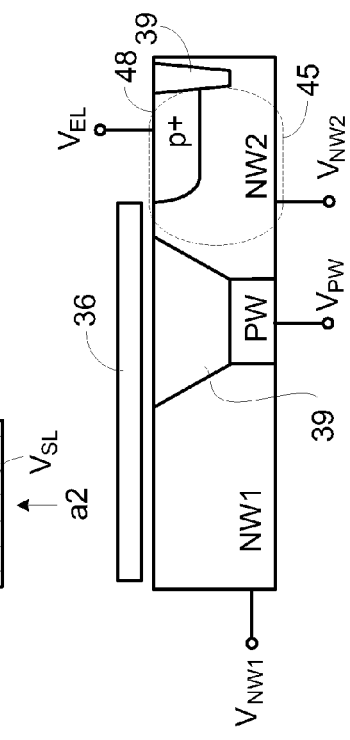

FIGS. 6A~6D schematically illustrate an erasable programmable single-poly nonvolatile memory according to a second embodiment of the present invention. FIG. 6A is a schematic top view illustrating the erasable programmable single-poly nonvolatile memory according to the second embodiment of the present invention. FIG. 6B is a schematic cross-sectional view illustrating the erasable programmable single-poly nonvolatile memory of FIG. 6A and taken along the second direction (b1-b2). FIG. 6C is a schematic cross-sectional view illustrating the erasable programmable single-poly nonvolatile memory of FIG. 6A and taken along the third direction (a3-a4). FIG. 6D is a schematic equivalent circuit diagram of the erasable programmable single-poly nonvolatile memory according to the second embodiment of the present invention. The cross-sectional view of the erasable programmable single-poly nonvolatile memory of this embodiment along the first direction (a1-a2) is similar to that of the first embodiment, and is not redundantly shown.

As shown in FIG. 6A, the erasable programmable single-poly nonvolatile memory of the second embodiment comprises two serially-connected p-type metal-oxide semiconductor (PMOS) transistors. These two PMOS transistors are constructed in a first N-well region (NW1). Three p-type doped regions 31, 32 and 33 are formed in the first N-well region (NW1). In addition, two polysilicon gates 34 and 36 are spanned over the areas between the three p-type doped regions 31, 32 and 33.

The first PMOS transistor is used as a select transistor, and the polysilicon gate 34 (also referred as a select gate) of the first PMOS transistor is connected to a select gate voltage $V_{SG}$. The p-type doped region 31 is a p-type doped source region and connected to a source line voltage $V_{SL}$. The p-type doped region 32 is a p-type doped drain region, which may be considered as a combination of a p-type doped drain region of the first PMOS transistor and a first p-type doped region of the second PMOS transistor. The polysilicon gate 36 (also referred as a floating gate) is disposed over the second PMOS transistor. The p-type doped region 33 is a second p-type doped region of the second PMOS transistor and connected to a bit line voltage $V_{BL}$. Moreover, the first N-well region (NW1) is connected to a first N-well voltage $V_{NW1}$.

During the ion implantation processes of forming the p-type doped regions 31, 32 and 33, the floating gate 36 and the select gate 34 are used as the implantation mask layers. Consequently, the floating gate 36 and the select gate 34 over the first N-well region (NW1) are p-type gates.

As shown in FIGS. 6A, 6B and 6C, the erasable programmable single-poly nonvolatile memory of the second embodiment comprises an additional PMOS transistor constructed in a second N-well region (NW2). The PMOS transistor also can be seen as a combination of the floating gate 36 and an erase gate region 45. In other words, the erase gate region 45 includes the second N-well region (NW2), a p-type doped region 48 and an n-type doped region 49. As shown in FIG. 6C, both the p-type doped region 48 and the n-type doped region 49 are adjacent to each other and are formed in the second N-well region (NW2). Moreover, as shown in FIG. 6B, the first N-well region (NW1) and the second N-well region (NW2) are completely isolated from each other by an isolation structure 39 and a P-type region (PW). In addition, the P-type region (PW) is connected to a PW voltage $V_{PW}$. In some embodiments, the first N-well region (NW1) and the second N-well region (NW2) are separated from each other and formed in a p-substrate in order to achieve complete isolation.

As shown in FIG. 6A, the floating gate 36 is extended to and is adjacent to the erase gate region 45. Moreover, the p-type doped region 48 may be considered as a combination of a p-type doped source region and a p-type doped drain region of the PMOS transistor. The p-type doped region 48 is connected to an erase line voltage $V_{EL}$. In addition, the n-type doped region 49 is connected to a second N-well voltage $V_{NW2}$ for the second N-well region (NW2) being connected to the second N-well voltage $V_{NW2}$. Moreover, the p-type doped region 48 and the n-type doped region 49 are also connected via silicide.

During the ion implantation process of forming the p-type doped region 48, the floating gate 36 is used as the implantation mask layer. Consequently, the floating gate 36 over the erase gate region 45 is also a p-type gate.

From the above discussions, the floating gate 36 of the erasable programmable single-poly nonvolatile memory of the second embodiment is completely a p-type polysilicon gate. Consequently, the erasing time and erasing voltage in the erased state can be effectively reduced.

Figures 7A, 7C:
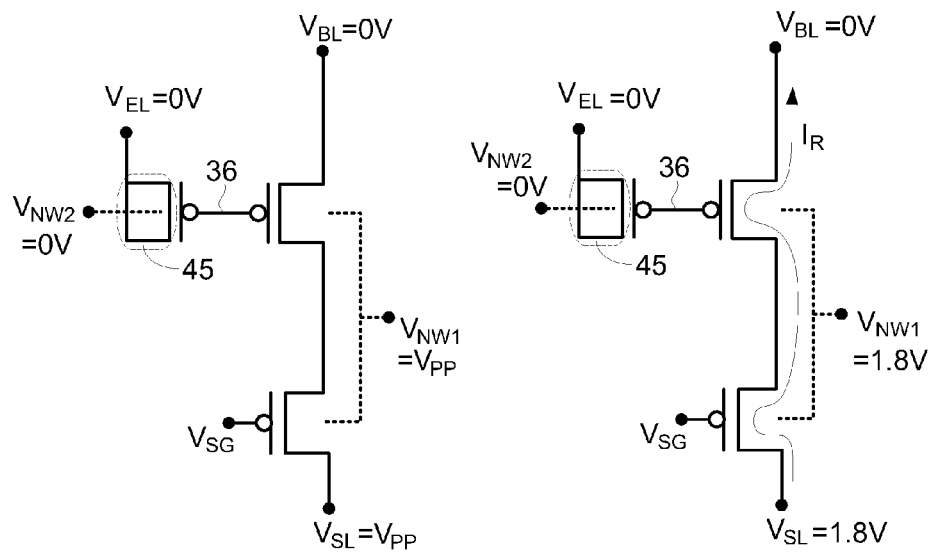
FIGS. 7A~7C schematically and respectively illustrate the bias voltages of the erasable programmable single-poly nonvolatile memory in a programmed state, an erased state and a read state according to the second embodiment of the present invention.
Figure 7B:
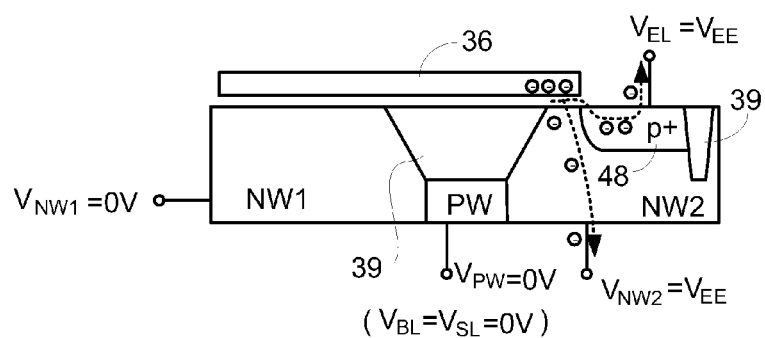

FIGS. 7A~7C schematically and respectively illustrate the bias voltages of the erasable programmable single-poly nonvolatile memory in a programmed state, an erased state and a read state according to the second embodiment of the present invention.

Please refer to FIG. 7A. In the programmed state, each of the bit line voltage $V_{BL}$, the erase line voltage $V_{EL}$, the second N-well voltage $V_{NW2}$ and the PW voltage $V_{PW}$ is equal to a ground voltage (0V). Whereas, each of the first N-well voltage $V_{NW1}$ and the source line voltage $V_{SL}$ is equal to a first positive voltage Vpp. The first positive voltage Vpp is in the range between +3.0V and +7.5V. In a case that the hot carriers (e.g. electrons) are transmitted through a channel region corresponding to the floating gate 36, the hot carriers are injected into the floating gate 36. Furthermore, the above mentioned bias voltages maybe need not be limited to the fixed voltages. For example, the erase line voltage $V_{EL}$ and the second N-well voltage $V_{NW2}$ can be in the range between 0V~$V_{DD2}$, wherein the $V_{DD2}$ is IO device voltage of the nonvolatile memory.

Please refer to FIG. 7B. In the erased state, each of the bit line voltage $V_{BL}$, the source line voltage $V_{SL}$, the first N-well voltage $V_{NW1}$ and the P-well voltage $V_{PW}$ is equal to the ground voltage (0V). Whereas, each of the erase line voltage $V_{EL}$ and the second N-well voltage $V_{NW2}$ is equal to a second positive voltage $V_{EE}$. The second positive voltage $V_{EE}$ is in the range between +6.5V and +18V. As shown in FIG. 7B, if each of the erase line voltage $V_{EL}$ and the second N-well voltage $V_{NW2}$ is equal to the second positive voltage $V_{EE}$, the storage carriers (e.g. electrons) are removed from the floating gate 36 and discharged out of the nonvolatile memory through the erase gate region 45 including both the p-type doped region 48 and the second N-well region (NW2). Consequently, in comparison with the first embodiment, the nonvolatile memory of the second embodiment has a shorter erase time.

Pleas refer to FIG. 7C. In the read state, the bit line voltage $V_{BL}$ is equal to 0V, the source line voltage $V_{SL}$ is equal to 1.8V, the first N-well voltage $V_{NW1}$ is equal to 1.8V, and each of the erase line voltage $V_{EL}$, the second N-well voltage $V_{NW2}$ and the P-well voltage $V_{PW}$ is equal to the ground voltage. Depending on whether the hot carriers are stored in the floating gate 36, different magnitudes of a read current $I_R$ are acquired. That is, in the read state, the storage state of the nonvolatile memory may be realized according to the read current $I_R$. Furthermore, the above mentioned bias voltages maybe need not be limited to the fixed voltages. For example, the bit line voltage $V_{BL}$ can be in the range between 0V to 0.5V, the source line voltage $V_{SL}$ and the N-well voltage $V_{NW}$ can be in the range between $V_{DD}$ and $V_{DD2}$, and the erase line voltage $V_{EL}$ can be in the range between 0V and $V_{DD2}$, wherein the $V_{DD}$ is the core device voltage of the nonvolatile memory and the $V_{DD2}$ is IO device voltage of the nonvolatile memory.

FIGS. 8A~8D schematically illustrate an erasable programmable single-poly nonvolatile memory according to a third embodiment of the present invention. FIG. 8A is a schematic top view illustrating the erasable programmable single-poly nonvolatile memory according to the third embodiment of the present invention. FIG. 8B is a schematic cross-sectional view illustrating the erasable programmable single-poly nonvolatile memory of FIG. 8A and taken along the fourth direction (b3-b4). FIG. 8C is a schematic cross-sectional view illustrating the erasable programmable single-poly nonvolatile memory of FIG. 8A and taken along the fifth direction (a5-a6). FIG. 8D is a schematic equivalent circuit diagram of the erasable programmable single-poly nonvolatile memory according to the third embodiment of the present invention. The cross-sectional views of the erasable programmable single-poly nonvolatile memory of this embodiment along the first direction (a1-a2), the second direction (b1-b2), and the third direction (a3-a4) are similar to that of the second embodiment, and are not redundantly shown.

As shown in FIG. 8A, the erasable programmable single-poly nonvolatile memory of the third embodiment comprises two serially-connected p-type metal-oxide semiconductor (PMOS) transistors. These two PMOS transistors are constructed in a first N-well region (NW1). Three p-type doped regions 31, 32 and 33 are formed in the first N-well region (NW1). In addition, two polysilicon gates 34 and 36 are spanned over the areas between the three p-type doped regions 31, 32 and 33.

The first PMOS transistor is used as a select transistor, and the polysilicon gate 34 (also referred as a select gate) of the first PMOS transistor is connected to a select gate voltage $V_{SG}$. The p-type doped region 31 is a p-type doped source region and connected to a source line voltage $V_{SL}$. The p-type doped region 32 is a p-type doped drain region, which may be considered as a combination of a p-type doped drain region of the first PMOS transistor and a first p-type doped region of the second PMOS transistor. The polysilicon gate 36 (also referred as a floating gate) is disposed over the second PMOS transistor. The p-type doped region 33 is a second p-type doped region of the second PMOS transistor and connected to a bit line voltage $V_{BL}$. Moreover, the first N-well region (NW1) is connected to a first N-well voltage $V_{NW1}$.

As shown in FIGS. 8A, 8B and 8C, the erasable programmable single-poly nonvolatile memory of the third embodiment comprises an additional PMOS transistor constructed in a second N-well region (NW2) and an NMOS transistor constructed in a P-well region (PW). The PMOS transistor also can be seen as a combination of the floating gate 36 and an erase gate region 45 and the NMOS transistor also can be seen as a combination of the floating gate 36 and an assist gate region 55. In other words, the erase gate region 45 includes the second N-well region (NW2), a p-type doped region 48 and an n-type doped region 49, and the assist gate region 55 includes an n-type doped region 53, an n-lightly doped drain (NLDD) 52, and the P-well region (PW). As shown in FIG. 8C, both the n-type doped region 53 and the n-lightly doped drain (NLDD) 52 are adjacent to each other and are formed in the P-well region (PW). Moreover, as shown in FIG. 8B, the first N-well region (NW1) and the second N-well region (NW2) are completely isolated from each other by an isolation structure 39 and a P-well region (PW). In some embodiments, the first N-well region (NW1) and the second N-well region (NW2) are separated from each other and formed in a p-substrate in order to achieve complete isolation.

As shown in FIG. 8A, the floating gate 36 is extended to and is adjacent to the erase gate region 45 and the assist gate region 55. Moreover, the p-type doped region 48 may be considered as a combination of a p-type doped source region and a p-type doped drain region of the PMOS transistor. The p-type doped region 48 is connected to an erase line voltage $V_{EL}$. In addition, the n-type doped region 49 is connected to a second N-well voltage $V_{NW2}$ for the second N-well region (NW2) being connected to the second N-well voltage $V_{NW2}$.

As shown in FIG. 8C, the NMOS transistor is located between the P-well region (PW) and the isolation structure 39. In addition, the n-lightly doped drain (NLDD) region 52 and the n-type doped region 53 are formed in the P-well region (PW). Moreover, the n-lightly doped drain (NLDD) region 52 and the n-type doped region 53 may be considered as a combination of an n-type doped source region and an n-type doped drain region. The n-type doped region 53 is connected to an assist gate voltage $V_{AG}$. In addition, the P-well region (PW) is connected to a P-well voltage $V_{PW}$.

From the above discussions, the floating gate 36 of the erasable programmable single-poly nonvolatile memory of the third embodiment further comprises an NMOS transistor.

In a case that the nonvolatile memory is in the programmed state, by applying a specific voltage to the assist gate region, the programming voltage and time can be effectively shorten. And, the specific voltage is capable of allowing the floating gate 36 to grab more hot carriers for PMOS channel hot carry mechanism. Under this circumstance, the efficiency of the nonvolatile memory in the programmed state is enhanced.

FIGS. 9A~9D schematically and respectively illustrate the bias voltages of the erasable programmable single-poly nonvolatile memory in a programmed state, an erased state and a read state according to the third embodiment of the present invention.

Please refer to FIG. 9A. In the programmed state, each of the bit line voltage $V_{BL}$, the erase line voltage $V_{EL}$, the second N-well voltage $V_{NW2}$ and the P-well voltage $V_{PW}$ is equal to a ground voltage (0V). Whereas, each of the first N-well voltage $V_{NW1}$ and the source line voltage $V_{SL}$ is equal to a first positive voltage $V_{pp}$. Moreover, the assist gate voltage $V_{AG}$ is equal to a third positive voltage $V_{AA}$. The first positive voltage $V_{pp}$ is in the range between +3.5V and +7.5V. The third positive voltage $V_{AA}$ is in the range between $+V_{DD}$ and +8.00V, wherein the $V_{DD}$ is the core device voltage of the nonvolatile memory. In a case that the hot carriers (e.g. electrons) are transmitted through a channel region corresponding to the floating gate 36, the hot carriers are injected into the floating gate 36.

In the schematic timing waveform diagram of FIG. 9B, the relationship between the source line voltage $V_{SL}$, the first N-well voltage $V_{NW1}$ and the assist gate voltage $V_{AG}$ is shown. During the program time T, each of the first N-well voltage $V_{NW1}$ and the source line voltage $V_{SL}$ is maintained at the first positive voltage $V_{pp}$. Whereas, after a delay time ΔT, the assist gate voltage $V_{AG}$ is maintained at the third positive voltage $V_{AA}$. In an embodiment, the delay time ΔT is at least higher than one-tenth of the program time T.

Please refer to FIG. 9C. In the erased state, each of the bit line voltage $V_{BL}$, the source line voltage $V_{SL}$, the first N-well voltage $V_{NW1}$, the assist gate voltage $V_{AG}$ and the P-well voltage $V_{PW}$ is equal to the ground voltage (0V). Whereas, each of the erase line voltage $V_{EL}$ and the second N-well voltage $V_{NW2}$ is equal to a second positive voltage $V_{EE}$. The second positive voltage $V_{EE}$ is in the range between +6.5V and +18V. As shown in FIG. 9C, if each of the erase line voltage $V_{EL}$ and the second N-well voltage $V_{NW2}$ is equal to the second positive voltage $V_{EE}$, the stored carriers (e.g. electrons) are removed from the floating gate 36 and discharged out of the nonvolatile memory through erase gate region 45.

Pleas refer to FIG. 9D. In the read state, the bit line voltage $V_{BL}$ is equal to 0V, the source line voltage $V_{SL}$ is equal to 1.8V, the first N-well voltage $V_{NW1}$ is equal to 1.8V, and each of the erase line voltage $V_{EL}$, the second N-well voltage $V_{NW2}$, the assist gate voltage $V_{AG}$ and the P-well voltage $V_{PW}$ is equal to the ground voltage. Depending on whether the hot carriers are stored in the floating gate 36, different magnitudes of a read current $I_R$ are acquired. That is, in the read state, the storage state of the nonvolatile memory is realized according to the read current $I_R$. Furthermore, the above mentioned bias voltages maybe need not be limited to the fixed voltages.

For example, the bit line voltage $V_{BL}$ can be in the range between 0V to 0.5V, the source line voltage $V_{SL}$ and the N-well voltage $V_{NW}$ can be in the range between $V_{DD}$ and $V_{DD2}$, and the erase line voltage $V_{EL}$ can be in the range between 0V and $V_{DD2}$, wherein the $V_{DD}$ is the core device voltage of the nonvolatile memory and the $V_{DD2}$ is IO device voltage of the nonvolatile memory.

FIGS. 10A~10C schematically illustrate an erasable programmable single-poly nonvolatile memory according to a fourth embodiment of the present invention. FIG. 10A is a schematic top view illustrating the erasable programmable single-poly nonvolatile memory according to the fourth embodiment of the present invention. FIG. 10B is a schematic cross-sectional view illustrating the erasable programmable single-poly nonvolatile memory of FIG. 10A and taken along the second direction (b1-b2). FIG. 10C is a schematic equivalent circuit diagram of the erasable programmable single-poly nonvolatile memory according to the fourth embodiment of the present invention. The cross-sectional view of the erasable programmable single-poly nonvolatile memory of this embodiment along the first direction (a1-a2) is similar to that of the first embodiment, and is not redundantly shown.

As shown in FIG. 10A, the erasable programmable single-poly nonvolatile memory of the fourth embodiment comprises two serially-connected p-type metal-oxide semiconductor (PMOS) transistors. These two PMOS transistors are constructed in an N-well region (NW). Three p-type doped regions 31, 32 and 33 are formed in the N-well region (NW). In addition, two polysilicon gates 34 and 36 are spanned over the areas between the three p-type doped regions 31, 32 and 33.

The first PMOS transistor is used as a select transistor, and the polysilicon gate 34 (also referred as a select gate) of the first PMOS transistor is connected to a select gate voltage $V_{SG}$. The p-type doped region 31 is a p-type doped source region and connected to a source line voltage $V_{SL}$. The p-type doped region 32 is a p-type doped drain region, which may be considered as a combination of a p-type doped drain region of the first PMOS transistor and a first p-type doped region of the second PMOS transistor. The polysilicon gate 36 (also referred as a floating gate) is disposed over the second PMOS transistor. The p-type doped region 33 is a second p-type doped region of the second PMOS transistor and connected to a bit line voltage $V_{BL}$. Moreover, the N-well region (NW) is connected to an N-well voltage $V_{NW}$.

As shown in FIGS. 10A and 10B, the erasable programmable single-poly nonvolatile memory of the fourth embodiment comprises an n-type metal-oxide semiconductor (NMOS) transistor constructed in a P-well region (PW). The NMOS transistor also can be seen as a combination of the floating gate 36 and an erase gate region 95. In other words, the erase gate region 95 includes the P-well region (PW), the n-type doped regions 92 and a double diffused drain (DDD) region 94. In addition, the n-type doped region 92 and the double diffused drain (DDD) region 94 are formed in the P-well region (PW). The n-type doped region 92 is formed in the double diffused drain (DDD) region 94. In addition, after manufacturing the DDD region 94, the defined mask pattern of manufacturing DDD region 94 is able to be used for etching the gate oxide above the erase gate region 95. That is to say, thickness of the gate oxide above the erase gate region 95 is thinner than the gate oxide under the floating gate 36. In this way, the erase line voltage $V_{EL}$ can be smaller in the typical erased state.

As shown in FIG. 10A, the floating gate 36 is extended to and is adjacent to the erase gate region 95. Moreover, the double diffused drain (DDD) region 94 and the n-type doped region 92 may be considered as a combination of an n-type doped source region and an n-type doped drain region. The P-well region (PW) is connected to a P-well voltage $V_{PW}$. As shown in FIG. 10B, an isolation structure 39 is formed between the P-well region (PW) and the N-well region (NW).

Figures 11A, 11C:
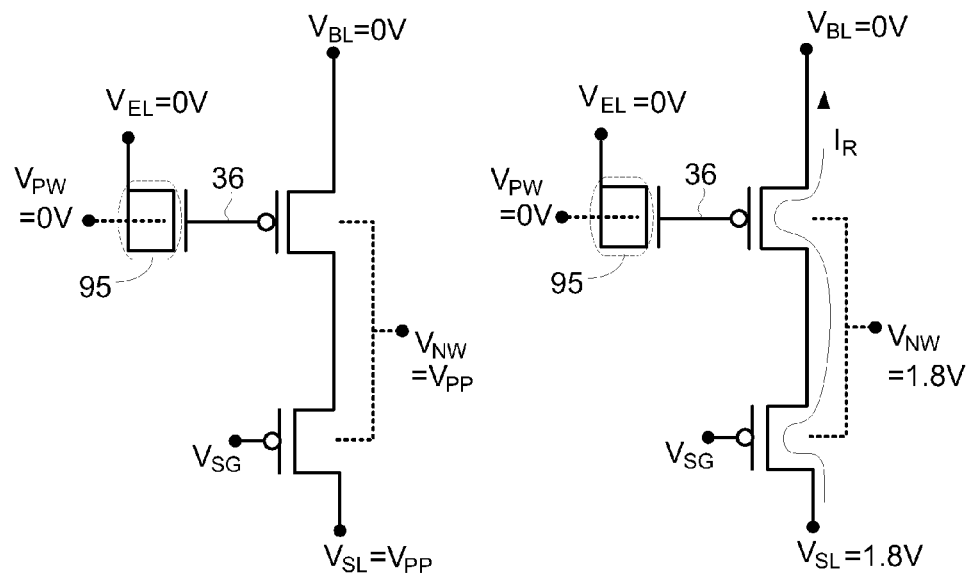
FIGS. 11A~11C schematically and respectively illustrate the bias voltages of the erasable programmable single-poly nonvolatile memory in a programmed state, an erased state and a read state according to the fourth embodiment of the present invention.
Figure 11B:
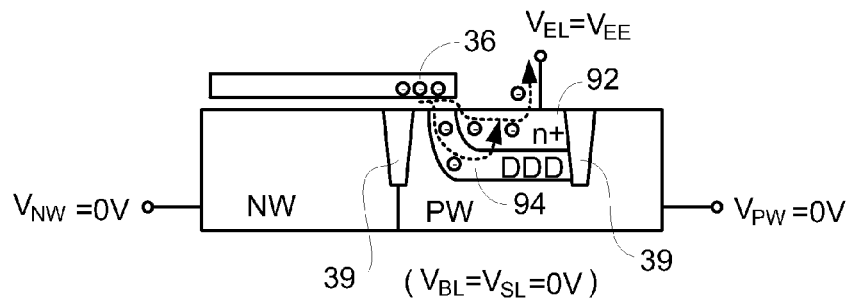

FIGS. 11A~11C schematically and respectively illustrate the bias voltages of the erasable programmable single-poly nonvolatile memory in a programmed state, an erased state and a read state according to the fourth embodiment of the present invention.

Please refer to FIG. 11A. In the programmed state, each of the bit line voltage $V_{BL}$, the erase line voltage $V_{EL}$ and the P-well voltage $V_{PW}$ is equal to a ground voltage (0V). Whereas, each of the N-well voltage $V_{NW}$ and the source line voltage $V_{SL}$ is equal to a first positive voltage $V_{pp}$. The first positive voltage $V_{pp}$ is in the range between +3.0V and +7.5V. In a case that the hot carriers (e.g. electrons) are transmitted through a channel region corresponding to the floating gate 36, the hot carriers are injected into the floating gate 36.

Please refer to FIG. 11B. In the erased state, each of the bit line voltage $V_{BL}$, the source line voltage $V_{SL}$, the N-well voltage $V_{NW}$ and the P-well voltage $V_{PW}$ is equal to the ground voltage (0V). Whereas, the erase line voltage $V_{EL}$ is equal to a second positive voltage VEE. The second positive voltage VEE is in the range between +6.5V and +18V. As shown in FIG. 11B, if the erase line voltage $V_{EL}$ is equal to the second positive voltage $V_{EE}$, the hot carriers (e.g. electrons) are removed from the floating gate 36 and discharged out of the nonvolatile memory through the n-type doped region 92 or the hot carriers (e.g. electrons) are removed from the floating gate 36 and discharged out of the nonvolatile memory through the double diffused drain (DDD) region 94 and the n-type doped region 92. Obviously, since the hot carriers can be discharged out of the nonvolatile memory through more paths, the erase time is effectively shortened.

Pleas refer to FIG. 11C. In the read state, the bit line voltage $V_{BA}$ is equal to 0V, the source line voltage $V_{SL}$ is equal to 1.8V, the N-well voltage $V_{NW}$ is equal to 1.8V, and each of the erase line voltage $V_{EL}$ and the P-well voltage $V_{PW}$ is equal to the ground voltage. Depending on whether the hot carriers are stored in the floating gate 36, different magnitudes of a read current $I_R$ are acquired. That is, in the read state, the storage state of the nonvolatile memory is realized according to the read current $I_R$. Furthermore, the above mentioned bias voltages maybe need not be limited to the fixed voltages. For example, the bit line voltage $V_{BL}$ can be in the range between 0V to 0.5V, the source line voltage $V_{SL}$ and the N-well voltage $V_{NW}$ can be in the range between $V_{DD}$ and $V_{DD2}$, and the erase line voltage $V_{EL}$ can be in the range between 0V and $V_{DD2}$, wherein the $V_{DD}$ is the core device voltage of the nonvolatile memory and the $V_{DD2}$ is IO device voltage of the nonvolatile memory.

From the above description, the erasable programmable single-poly nonvolatile memory of the present invention is capable of solving the drawbacks of using ultraviolet light to remove hot carriers. That is, by providing the erase line voltage $V_{EL}$, storage state of the nonvolatile memory of the present invention is changeable.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An erasable programmable single-poly nonvolatile memory, comprising:
   a first PMOS transistor comprising a select gate, a first p-type doped region, and a second p-type doped region, wherein the first PMOS transistor is constructed in a first N-well region connected to a first N-well voltage, the select gate is connected to a select gate voltage, and the first p-type doped region is connected to a source line voltage;

a second PMOS transistor comprising the second p-type doped region, a third p-type doped region, and a floating gate, wherein the second PMOS transistor is constructed in the first N-well region, the third p-type doped region is connected to a bit line voltage; and an erase gate region adjacent to the floating gate, wherein the erase gate region comprises a n-type doped region connected to an erase line voltage and a P-type region connected to a P-well voltage, and the n-type doped region is constructed in the P-type region;

wherein a first portion of the floating gate over the first N-well region is a p-type gate and a second portion of the floating gate over the erase gate region is a n-type gate.

2. An erasable programmable single-poly nonvolatile memory, comprising:

a first PMOS transistor comprising a select gate, a first p-type doped region, and a second p-type doped region, wherein the first PMOS transistor is constructed in a first N-well region connected to a first N-well voltage, the select gate is connected to a select gate voltage, and the first p-type doped region is connected to a source line voltage;

a second PMOS transistor comprising the second p-type doped region, a third p-type doped region, and a floating gate, wherein the second PMOS transistor is constructed in the first N-well region, the third p-type doped region is connected to a bit line voltage; and an erase gate region adjacent to the floating gate, wherein the erase gate region comprises a n-type doped region connected to a second N-well voltage, a fourth p-type doped region connected to an erase line voltage and a second N-well region, and the n-type doped region and the fourth p-type doped region are constructed in the second N-well region.

3. The erasable programmable single-poly nonvolatile memory as claimed in claim 2, wherein the floating gate over the first N-well region and the second N-well region is a p-type gate.

4. The erasable programmable single-poly nonvolatile memory as claimed in claim 2, wherein the first N-well region and the second N-well region are completely isolated from each other by arranging an isolation structure and a P-type region between the first N-well region and the second N-well region and the P-type region is connected to a P-well voltage.

5. The erasable programmable single-poly nonvolatile memory as claimed in claim 4, wherein in a programmed state, a first voltage is provided as the source line voltage and the first N-well voltage, so that a plurality of hot carriers are injected into the floating gate.

6. The erasable programmable single-poly nonvolatile memory as claimed in claim 5, wherein in the programmed state, a ground voltage is provided as the bit line voltage, the P-well voltage, the erase line voltage and the second N-well voltage.

7. The erasable programmable single-poly nonvolatile memory as claimed in claim 4, wherein in an erased state, a second voltage is provided as the erase line voltage and the second N-well voltage, so that a plurality of stored carriers are removed from the floating gate and discharged out of the nonvolatile memory through the erase gate region.

8. The erasable programmable single-poly nonvolatile memory as claimed in claim 7, wherein in the erased state, a ground voltage is provided as the bit line voltage, the P-well voltage, the first N-well voltage and the source line voltage.

9. The erasable programmable single-poly nonvolatile memory as claimed in claim 2, further comprising an assist gate region adjacent to the floating gate, wherein the assist gate region comprises a second n-type doped region connected to an assist gate voltage, a n-lightly doped drain region under the floating gate, and a P-well region connected to a P-well voltage, wherein the second n-type doped region and the n-lightly doped drain region are constructed in the P-well region.

10. The erasable programmable single-poly nonvolatile memory as claimed in claim 9, wherein the P-well region is arranged between the first N-well region and the second N-well region, and the first N-well region and the second N-well region are completely isolated from each other.

11. The erasable programmable single-poly nonvolatile memory as claimed in claim 9, wherein in a programmed state, a first voltage is provided as the source line voltage and the first N-well voltage, and a third voltage is provided as the assist gate voltage, so that a plurality of hot carriers are injected into the floating gate.

12. The erasable programmable single-poly nonvolatile memory as claimed in claim 11, wherein the third voltage is provided as the assist gate voltage after the first voltage has been provided as the source line voltage and the first N-well voltage for a delay time.

13. The erasable programmable single-poly nonvolatile memory as claimed in claim 12, wherein in the programmed state, a ground voltage is provided as the bit line voltage, the P-well voltage, the erase line voltage and the second N-well voltage.

14. An erasable programmable single-poly nonvolatile memory, comprising:

a first PMOS transistor comprising a select gate, a first p-type doped region, and a second p-type doped region, wherein the first PMOS transistor is constructed in a first N-well region connected to a first N-well voltage, the select gate is connected to a select gate voltage, and the first p-type doped region is connected to a source line voltage;

a second PMOS transistor comprising the second p-type doped region, a third p-type doped region, and a floating gate, wherein the second PMOS transistor is constructed in the first N-well region, the third p-type doped region is connected to a bit line voltage; and an erase gate region adjacent to the floating gate, wherein the erase gate region comprises a n-type doped region connected to an erase line voltage, double diffused drain region, and a P-well region connected to a P-well voltage, and the n-type doped region is constructed in the double diffused drain region and the double diffused drain region is constructed in the P-well region.

15. The erasable programmable single-poly nonvolatile memory as claimed in claim 14, wherein a thickness of a gate oxide above the erase gate region is smaller than a thickness of gate oxide under the floating gate.

16. The erasable programmable single-poly nonvolatile memory as claimed in claim 14, wherein an isolation structure is arranged between the P-well region and the N-well region.

17. The erasable programmable single-poly nonvolatile memory as claimed in claim 14, wherein in a programmed state, a first voltage is provided as the source line voltage and the first N-well voltage, so that a plurality of hot carriers are injected into the floating gate.

18. The erasable programmable single-poly nonvolatile memory as claimed in claim 17, wherein in the programmed state, a ground voltage is provided as the bit line voltage, the P-well voltage and the erase line voltage.

19. The erasable programmable single-poly nonvolatile memory as claimed in claim 14, wherein in an erased state, a second voltage is provided as the erase line voltage, so that a plurality of stored carriers are removed from the floating gate and discharged out of the nonvolatile memory through the erase gate region.

20. The erasable programmable single-poly nonvolatile memory as claimed in claim 19, wherein in the erased state, a ground voltage is provided as the bit line voltage, the P-well voltage, the N-well voltage and the source line voltage.

\* \* \* \* \*